US007569191B2

(12) United States Patent
Ganguli et al.

(10) Patent No.: US 7,569,191 B2
(45) Date of Patent: *Aug. 4, 2009

(54) METHOD AND APPARATUS FOR PROVIDING PRECURSOR GAS TO A PROCESSING CHAMBER

(75) Inventors: Seshadri Ganguli, Sunnyvale, CA (US); Ling Chen, Sunnyvale, CA (US); Vincent W. Ku, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/233,464

(22) Filed: Sep. 18, 2008

(65) Prior Publication Data

US 2009/0011129 A1   Jan. 8, 2009

Related U.S. Application Data

(63) Continuation of application No. 11/613,153, filed on Dec. 19, 2006, now Pat. No. 7,429,361, which is a continuation of application No. 10/198,727, filed on Jul. 17, 2002, now Pat. No. 7,186,385.

(51) Int. Cl.
*B01D 7/00* (2006.01)

(52) U.S. Cl. .................. 422/129; 422/228; 422/232; 422/198; 392/386; 392/388; 392/389; 392/390

(58) Field of Classification Search ................ 422/129; 392/388; 427/248.1, 250, 252; 118/715; 117/201

See application file for complete search history.

(56) References Cited

U.S. PATENT DOCUMENTS

| 3,844,306 A | 10/1974 | Hill |
| 4,058,430 A | 11/1977 | Suntola et al. |
| 4,276,243 A | 6/1981 | Partus |

(Continued)

FOREIGN PATENT DOCUMENTS

EP        0497267        8/1992

(Continued)

OTHER PUBLICATIONS

Chiu, et al. "Synthesis and characterization of organoimido complexes of tantalum; potential single-source precursors to tantalum nitride," Polyhdedron, vol. 17, Nos. 13-14, pp. 2187-2190, 1998.

(Continued)

*Primary Examiner*—Alexa D. Neckel
*Assistant Examiner*—Kaity V. Handal
(74) *Attorney, Agent, or Firm*—Patterson & Sheridan, LLP

(57) ABSTRACT

Embodiments of the invention provide a method and an apparatus for generating a gaseous chemical precursor for a processing system. In one embodiment, an apparatus for generating the gaseous chemical precursor used in a vapor deposition processing system is provided and includes a canister having a sidewall, a top, and a bottom encompassing an interior volume therein, an inlet port and an outlet port in fluid communication with the interior volume, and an inlet tube extending from the inlet port into the canister, wherein the inlet tube contains an outlet positioned to direct a gas flow away from the outlet port and towards the sidewall of the canister.

22 Claims, 4 Drawing Sheets

U.S. PATENT DOCUMENTS

| | | |
|---|---|---|
| 4,369,031 A | 1/1983 | Goldman et al. |
| 4,389,973 A | 6/1983 | Suntola et al. |
| 4,413,022 A | 11/1983 | Suntola et al. |
| 4,415,275 A | 11/1983 | Dietrich |
| 4,717,596 A | 1/1988 | Barbee et al. |
| 4,761,269 A | 8/1988 | Conger et al. |
| 4,762,651 A | 8/1988 | Parker et al. |
| 4,783,343 A | 11/1988 | Sato et al. |
| 4,817,557 A | 4/1989 | Diem et al. |
| 4,834,831 A | 5/1989 | Nishizawa et al. |
| 4,911,101 A | 3/1990 | Ballingall, III et al. |
| 4,975,252 A | 12/1990 | Nishizawa et al. |
| 4,993,357 A | 2/1991 | Scholz et al. |
| 5,000,113 A | 3/1991 | Wang et al. |
| 5,027,746 A | 7/1991 | Frijlink et al. |
| 5,098,741 A | 3/1992 | Nolet et al. |
| 5,173,327 A | 12/1992 | Sandhu et al. |
| 5,178,681 A | 1/1993 | Moore et al. |
| 5,188,808 A | 2/1993 | Lilja et al. |
| 5,221,449 A | 6/1993 | Colgan et al. |
| 5,225,251 A | 7/1993 | Esrom et al. |
| 5,225,366 A | 7/1993 | Yoder |
| 5,261,959 A | 11/1993 | Gasworth |
| 5,281,274 A | 1/1994 | Yoder |
| 5,281,485 A | 1/1994 | Colgan et al. |
| 5,294,286 A | 3/1994 | Nishizawa et al. |
| 5,338,362 A | 8/1994 | Imahashi et al. |
| 5,354,516 A | 10/1994 | Tomita |
| 5,374,570 A | 12/1994 | Nasu et al. |
| 5,377,429 A | 1/1995 | Sandhu et al. |
| 5,381,605 A | 1/1995 | Krafft |
| 5,441,703 A | 8/1995 | Jurgensen et al. |
| 5,443,647 A | 8/1995 | Aucoin et al. |
| 5,480,818 A | 1/1996 | Matsumoto et al. |
| 5,483,919 A | 1/1996 | Yokoyama et al. |
| 5,496,408 A | 3/1996 | Motoda et al. |
| 5,503,875 A | 4/1996 | Imai et al. |
| 5,558,717 A | 9/1996 | Zhao et al. |
| 5,595,603 A | 1/1997 | Klinedinst et al. |
| 5,620,524 A | 4/1997 | Fan et al. |
| 5,630,878 A | 5/1997 | Miyamoto et al. |
| 5,645,642 A | 7/1997 | Nishizato et al. |
| 5,674,574 A | 10/1997 | Atwell et al. |
| 5,674,786 A | 10/1997 | Turner et al. |
| 5,711,811 A | 1/1998 | Suntola et al. |
| 5,730,802 A | 3/1998 | Ishizumi et al. |
| 5,764,849 A | 6/1998 | Atwell |
| 5,796,116 A | 8/1998 | Nakata et al. |
| 5,807,792 A | 9/1998 | Ilg et al. |
| 5,820,678 A | 10/1998 | Hubert et al. |
| 5,835,677 A | 11/1998 | Li et al. |
| 5,846,332 A | 12/1998 | Zhao et al. |
| 5,855,680 A | 1/1999 | Soininen et al. |
| 5,879,459 A | 3/1999 | Gadgil et al. |
| 5,882,411 A | 3/1999 | Zhao et al. |
| 5,882,416 A | 3/1999 | Van Buskirk et al. |
| 5,906,683 A | 5/1999 | Chen et al. |
| 5,916,365 A | 6/1999 | Sherman |
| 5,923,056 A | 7/1999 | Lee et al. |
| 5,942,089 A | 8/1999 | Sproul et al. |
| 5,951,771 A | 9/1999 | Raney et al. |
| 5,966,499 A | 10/1999 | Hinkle et al. |
| 5,968,588 A | 10/1999 | Sivaramakrishnan et al. |
| 5,972,430 A | 10/1999 | DiMeo, Jr. et al. |
| 6,015,590 A | 1/2000 | Suntola et al. |
| 6,015,595 A | 1/2000 | Felts |
| 6,015,917 A | 1/2000 | Bhandari et al. |
| 6,042,652 A | 3/2000 | Hyun et al. |
| 6,066,358 A | 5/2000 | Guo et al. |
| 6,071,572 A | 6/2000 | Mosely et al. |
| 6,077,396 A | 6/2000 | LaRiviere |
| 6,079,356 A | 6/2000 | Umotoy et al. |
| 6,084,302 A | 7/2000 | Sandhu |
| 6,099,904 A | 8/2000 | Mak et al. |
| 6,107,198 A | 8/2000 | Lin et al. |
| 6,124,158 A | 9/2000 | Dautartas et al. |
| 6,136,725 A | 10/2000 | Loan et al. |
| 6,139,640 A | 10/2000 | Ramos et al. |
| 6,139,700 A | 10/2000 | Kang et al. |
| 6,143,080 A | 11/2000 | Bartholomew et al. |
| 6,143,082 A | 11/2000 | McInerney et al. |
| 6,144,060 A | 11/2000 | Park et al. |
| 6,156,382 A | 12/2000 | Rajagopalan et al. |
| 6,162,488 A | 12/2000 | Gevelber et al. |
| 6,162,715 A | 12/2000 | Mak et al. |
| 6,174,377 B1 | 1/2001 | Doering et al. |
| 6,174,809 B1 | 1/2001 | Kang et al. |
| 6,183,563 B1 | 2/2001 | Choi et al. |
| 6,189,323 B1 | 2/2001 | Nakamura et al. |
| 6,197,683 B1 | 3/2001 | Kang et al. |
| 6,200,893 B1 | 3/2001 | Sneh |
| 6,203,613 B1 | 3/2001 | Gates et al. |
| 6,206,967 B1 | 3/2001 | Mak et al. |
| 6,207,487 B1 | 3/2001 | Kim et al. |
| 6,224,681 B1 | 5/2001 | Sivaramakrishnan et al. |
| 6,231,672 B1 | 5/2001 | Choi et al. |
| 6,248,434 B1 | 6/2001 | Rodiger et al. |
| 6,251,190 B1 | 6/2001 | Mak et al. |
| 6,270,572 B1 | 8/2001 | Kim et al. |
| 6,271,148 B1 | 8/2001 | Kao et al. |
| 6,284,646 B1 | 9/2001 | Leem et al. |
| 6,287,965 B1 | 9/2001 | Kang et al. |
| 6,302,965 B1 | 10/2001 | Umotoy et al. |
| 6,305,314 B1 | 10/2001 | Sneh et al. |
| 6,306,216 B1 | 10/2001 | Kim et al. |
| 6,309,713 B1 | 10/2001 | Mak et al. |
| 6,328,221 B1 | 12/2001 | Moore et al. |
| 6,342,277 B1 | 1/2002 | Sherman |
| 6,348,376 B2 | 2/2002 | Lim et al. |
| 6,358,829 B2 | 3/2002 | Yoon et al. |
| 6,372,598 B2 | 4/2002 | Kang et al. |
| 6,379,748 B1 | 4/2002 | Bhandari et al. |
| 6,391,785 B1 | 5/2002 | Satta et al. |
| 6,399,491 B2 | 6/2002 | Jeon et al. |
| 6,416,577 B1 | 7/2002 | Suntoloa et al. |
| 6,416,822 B1 | 7/2002 | Chiang et al. |
| 6,428,859 B1 | 8/2002 | Chiang et al. |
| 6,433,314 B1 | 8/2002 | Mandrekar et al. |
| 6,444,038 B1 * | 9/2002 | Rangarajan et al. ......... 118/715 |
| 6,447,607 B2 | 9/2002 | Soininen et al. |
| 6,451,119 B2 | 9/2002 | Sneh et al. |
| 6,451,695 B2 | 9/2002 | Sneh |
| 6,454,860 B2 | 9/2002 | Metzner et al. |
| 6,468,924 B2 | 10/2002 | Lee et al. |
| 6,475,276 B1 | 11/2002 | Elers et al. |
| 6,475,910 B1 | 11/2002 | Sneh |
| 6,478,872 B1 | 11/2002 | Chae et al. |
| 6,481,945 B1 | 11/2002 | Hasper et al. |
| 6,482,262 B1 | 11/2002 | Elers et al. |
| 6,482,733 B2 | 11/2002 | Raaijmakers et al. |
| 6,511,539 B1 | 1/2003 | Raaijmakers et al. |
| 6,524,952 B1 | 2/2003 | Srinivas et al. |
| 6,548,112 B1 | 4/2003 | Hillman et al. |
| 6,551,406 B2 | 4/2003 | Kilpi et al. |
| 6,551,929 B1 | 4/2003 | Kori et al. |
| 6,561,498 B2 | 5/2003 | Tompkins et al. |
| 6,569,501 B2 | 5/2003 | Chiang et al. |
| 6,572,705 B1 | 6/2003 | Suntola et al. |
| 6,578,287 B2 | 6/2003 | Aswad |
| 6,579,372 B2 | 6/2003 | Park |
| 6,585,823 B1 | 7/2003 | Van Wijck et al. |
| 6,593,484 B2 | 7/2003 | Yasuhara et al. |
| 6,596,602 B2 | 7/2003 | Iizuka et al. |
| 6,599,572 B2 | 7/2003 | Saanila et al. |

| | | | | | |
|---|---|---|---|---|---|
| 6,607,976 B2 | 8/2003 | Chen et al. | 2002/0017242 A1 | 2/2002 | Hamaguchi et al. |
| 6,620,723 B1 | 9/2003 | Byun et al. | 2002/0020869 A1 | 2/2002 | Park et al. |
| 6,630,030 B1 | 10/2003 | Suntola et al. | 2002/0021544 A1 | 2/2002 | Cho et al. |
| 6,630,201 B2 | 10/2003 | Chiang et al. | 2002/0031618 A1 | 3/2002 | Sherman |
| 6,632,279 B1 | 10/2003 | Ritala et al. | 2002/0041931 A1 | 4/2002 | Suntola et al. |
| 6,660,126 B2 | 12/2003 | Nguyen et al. | 2002/0048635 A1 | 4/2002 | Kim et al. |
| 6,716,287 B1 | 4/2004 | Santiago et al. | 2002/0052097 A1 | 5/2002 | Park |
| 6,718,126 B2 | 4/2004 | Lei | 2002/0060363 A1 | 5/2002 | Xi et al. |
| 6,720,027 B2 | 4/2004 | Yang et al. | 2002/0066411 A1 | 6/2002 | Chiang et al. |
| 6,730,267 B2 | 5/2004 | Stringer et al. | 2002/0068458 A1 | 6/2002 | Chiang et al. |
| 6,734,020 B2 | 5/2004 | Lu et al. | 2002/0073924 A1 | 6/2002 | Chiang et al. |
| 6,772,072 B2 | 8/2004 | Ganguli et al. | 2002/0076481 A1 | 6/2002 | Chiang et al. |
| 6,773,507 B2 | 8/2004 | Jallepally et al. | 2002/0076507 A1 | 6/2002 | Chiang et al. |
| 6,777,352 B2 | 8/2004 | Tepman et al. | 2002/0076508 A1 | 6/2002 | Chiang et al. |
| 6,778,762 B1 | 8/2004 | Shareef et al. | 2002/0076837 A1 | 6/2002 | Hujanen et al. |
| 6,784,096 B2 | 8/2004 | Chen et al. | 2002/0086106 A1 | 7/2002 | Park et al. |
| 6,790,773 B1 | 9/2004 | Drewery et al. | 2002/0086111 A1 | 7/2002 | Byun et al. |
| 6,797,108 B2 | 9/2004 | Wendling | 2002/0086507 A1 | 7/2002 | Park et al. |
| 6,800,173 B2 | 10/2004 | Chiang et al. | 2002/0092471 A1 | 7/2002 | Kang et al. |
| 6,803,272 B1 | 10/2004 | Halliyal et al. | 2002/0094689 A1 | 7/2002 | Park |
| 6,815,285 B2 | 11/2004 | Choi et al. | 2002/0098627 A1 | 7/2002 | Pomarede et al. |
| 6,818,094 B2 | 11/2004 | Yudovsky | 2002/0104481 A1 | 8/2002 | Chiang et al. |
| 6,821,563 B2 | 11/2004 | Yudovsky | 2002/0106536 A1 | 8/2002 | Lee et al. |
| 6,827,815 B2 | 12/2004 | Hytros et al. | 2002/0106846 A1 | 8/2002 | Seutter et al. |
| 6,838,125 B2 | 1/2005 | Chung et al. | 2002/0108570 A1 | 8/2002 | Lindfors |
| 6,866,746 B2 | 3/2005 | Lei et al. | 2002/0110991 A1 | 8/2002 | Li |
| 6,866,951 B2 | 3/2005 | Foley et al. | 2002/0115886 A1 | 8/2002 | Yasuhara et al. |
| 6,868,859 B2 | 3/2005 | Yudovsky | 2002/0117399 A1 | 8/2002 | Chen et al. |
| 6,878,206 B2 | 4/2005 | Tzu et al. | 2002/0121241 A1 | 9/2002 | Nguyen et al. |
| 6,881,437 B2 | 4/2005 | Ivanov et al. | 2002/0121342 A1 | 9/2002 | Nguyen et al. |
| 6,893,915 B2 | 5/2005 | Park et al. | 2002/0127336 A1 | 9/2002 | Chen et al. |
| 6,902,624 B2 | 6/2005 | Seidel et al. | 2002/0127745 A1 | 9/2002 | Lu et al. |
| 6,905,541 B2 | 6/2005 | Chen et al. | 2002/0132473 A1 | 9/2002 | Chiang et al. |
| 6,911,093 B2 | 6/2005 | Stacey et al. | 2002/0134307 A1 | 9/2002 | Choi |
| 6,915,592 B2 | 7/2005 | Guenther | 2002/0144655 A1 | 10/2002 | Chiang et al. |
| 6,921,062 B2 | 7/2005 | Gregg et al. | 2002/0144657 A1 | 10/2002 | Chiang et al. |
| 6,946,033 B2 | 9/2005 | Tsuei et al. | 2002/0145210 A1 | 10/2002 | Tompkins et al. |
| 6,955,211 B2 | 10/2005 | Ku et al. | 2002/0146511 A1 | 10/2002 | Chiang et al. |
| 6,983,892 B2 | 1/2006 | Noorbakhsh et al. | 2002/0155722 A1 | 10/2002 | Satta et al. |
| 6,998,014 B2 | 2/2006 | Chen et al. | 2002/0162506 A1 | 11/2002 | Sneh et al. |
| 7,066,194 B2 | 6/2006 | Ku et al. | 2002/0164421 A1 | 11/2002 | Chiang et al. |
| 7,186,385 B2 | 3/2007 | Ganguli et al. | 2002/0164423 A1 | 11/2002 | Chiang et al. |
| 7,195,026 B2 | 3/2007 | Znamensky et al. | 2002/0177282 A1 | 11/2002 | Song |
| 7,228,873 B2 | 6/2007 | Ku et al. | 2002/0182320 A1 | 12/2002 | Leskela et al. |
| 7,237,565 B2 | 7/2007 | Hioki et al. | 2002/0187256 A1 | 12/2002 | Elers et al. |
| 7,270,709 B2 | 9/2007 | Chen et al. | 2002/0197402 A1 | 12/2002 | Chiang et al. |
| 7,294,208 B2 | 11/2007 | Guenther | 2003/0004723 A1 | 1/2003 | Chihara |
| 7,300,038 B2 | 11/2007 | Gregg et al. | 2003/0010451 A1 | 1/2003 | Tzu et al. |
| 7,429,361 B2 | 9/2008 | Ganguli et al. | 2003/0013320 A1 | 1/2003 | Kim et al. |
| 2001/0000866 A1 | 5/2001 | Sneh et al. | 2003/0017697 A1 | 1/2003 | Choi et al. |
| 2001/0002280 A1 | 5/2001 | Sneh | 2003/0022338 A1 | 1/2003 | Ruben et al. |
| 2001/0003603 A1 | 6/2001 | Eguchi et al. | 2003/0023338 A1 | 1/2003 | Chin et al. |
| 2001/0009140 A1 | 7/2001 | Bondestam et al. | 2003/0031807 A1 | 2/2003 | Elers et al. |
| 2001/0009695 A1 | 7/2001 | Saanila et al. | 2003/0038369 A1 | 2/2003 | Layadi et al. |
| 2001/0011526 A1 | 8/2001 | Doering et al. | 2003/0042630 A1 | 3/2003 | Babcoke et al. |
| 2001/0013312 A1 | 8/2001 | Soininen et al. | 2003/0049375 A1 | 3/2003 | Nguyen et al. |
| 2001/0014371 A1 | 8/2001 | Kilpi | 2003/0049931 A1 | 3/2003 | Byun et al. |
| 2001/0024387 A1 | 9/2001 | Raaijmakers et al. | 2003/0049942 A1 | 3/2003 | Haukka et al. |
| 2001/0025979 A1 | 10/2001 | Kim et al. | 2003/0053799 A1 | 3/2003 | Lei |
| 2001/0028924 A1 | 10/2001 | Sherman | 2003/0057526 A1 | 3/2003 | Chung et al. |
| 2001/0034123 A1 | 10/2001 | Jeon et al. | 2003/0057527 A1 | 3/2003 | Chung et al. |
| 2001/0041250 A1 | 11/2001 | Werkhoven et al. | 2003/0059538 A1 | 3/2003 | Chung et al. |
| 2001/0042523 A1 | 11/2001 | Kesala | 2003/0072913 A1 | 4/2003 | Chou et al. |
| 2001/0042799 A1 | 11/2001 | Kim et al. | 2003/0072975 A1 | 4/2003 | Shero et al. |
| 2001/0054377 A1 | 12/2001 | Lindfors et al. | 2003/0075273 A1 | 4/2003 | Kilpela et al. |
| 2001/0054730 A1 | 12/2001 | Kim et al. | 2003/0075925 A1 | 4/2003 | Lindfors et al. |
| 2001/0054769 A1 | 12/2001 | Raaijmakers et al. | 2003/0079686 A1 | 5/2003 | Chen et al. |
| 2002/0000196 A1 | 1/2002 | Park | 2003/0082296 A1 | 5/2003 | Elers et al. |
| 2002/0000598 A1 | 1/2002 | Kang et al. | 2003/0082301 A1 | 5/2003 | Chen et al. |
| 2002/0007790 A1 | 1/2002 | Park | 2003/0082307 A1 | 5/2003 | Chung et al. |
| 2002/0009544 A1 | 1/2002 | McFeely et al. | 2003/0089308 A1 | 5/2003 | Raaijmakers |
| 2002/0009896 A1 | 1/2002 | Sandhu et al. | 2003/0101927 A1 | 6/2003 | Raaijmakers |
| 2002/0013051 A1 | 1/2002 | Hautala et al. | 2003/0101938 A1 | 6/2003 | Ronsse et al. |

| | | |
|---|---|---|
| 2003/0106490 A1 | 6/2003 | Jallepally et al. |
| 2003/0108674 A1 | 6/2003 | Chung et al. |
| 2003/0113187 A1 | 6/2003 | Lei et al. |
| 2003/0116087 A1 | 6/2003 | Nguyen et al. |
| 2003/0121241 A1 | 7/2003 | Belke |
| 2003/0121469 A1 | 7/2003 | Lindfors et al. |
| 2003/0121608 A1 | 7/2003 | Chen et al. |
| 2003/0121609 A1 | 7/2003 | Ohmi et al. |
| 2003/0124262 A1 | 7/2003 | Chen et al. |
| 2003/0140854 A1 | 7/2003 | Kilpi |
| 2003/0143328 A1 | 7/2003 | Chen et al. |
| 2003/0143747 A1 | 7/2003 | Bondestam et al. |
| 2003/0153177 A1 | 8/2003 | Tepman et al. |
| 2003/0168750 A1 | 9/2003 | Basceri et al. |
| 2003/0172872 A1 | 9/2003 | Thakur et al. |
| 2003/0173586 A1 | 9/2003 | Moriwaki et al. |
| 2003/0186495 A1 | 10/2003 | Saanila et al. |
| 2003/0190423 A1 | 10/2003 | Yang et al. |
| 2003/0190804 A1 | 10/2003 | Glenn et al. |
| 2003/0194493 A1 | 10/2003 | Chang et al. |
| 2003/0198740 A1 | 10/2003 | Wendling |
| 2003/0198754 A1 | 10/2003 | Xi et al. |
| 2003/0205729 A1 | 11/2003 | Basceri et al. |
| 2003/0213560 A1 | 11/2003 | Wang et al. |
| 2003/0213987 A1 | 11/2003 | Basceri et al. |
| 2003/0216981 A1 | 11/2003 | Tillman |
| 2003/0219942 A1 | 11/2003 | Choi et al. |
| 2003/0221780 A1 | 12/2003 | Lei et al. |
| 2003/0224107 A1 | 12/2003 | Lindfors et al. |
| 2003/0224578 A1 | 12/2003 | Chung et al. |
| 2003/0224600 A1 | 12/2003 | Cao et al. |
| 2003/0232497 A1 | 12/2003 | Xi et al. |
| 2003/0235961 A1 | 12/2003 | Metzner et al. |
| 2004/0005749 A1 | 1/2004 | Choi et al. |
| 2004/0009307 A1 | 1/2004 | Koh et al. |
| 2004/0011404 A1 | 1/2004 | Ku et al. |
| 2004/0011504 A1 | 1/2004 | Ku et al. |
| 2004/0013577 A1 | 1/2004 | Ganguli et al. |
| 2004/0014320 A1 | 1/2004 | Chen et al. |
| 2004/0015300 A1 | 1/2004 | Ganguli et al. |
| 2004/0016404 A1 | 1/2004 | Gregg et al. |
| 2004/0018304 A1 | 1/2004 | Chung et al. |
| 2004/0018723 A1 | 1/2004 | Byun et al. |
| 2004/0018747 A1 | 1/2004 | Lee et al. |
| 2004/0025370 A1 | 2/2004 | Guenther |
| 2004/0033698 A1 | 2/2004 | Lee et al. |
| 2004/0046197 A1 | 3/2004 | Basceri et al. |
| 2004/0065255 A1 | 4/2004 | Yang et al. |
| 2004/0069227 A1 | 4/2004 | Ku et al. |
| 2004/0071897 A1 | 4/2004 | Verplancken et al. |
| 2004/0077183 A1 | 4/2004 | Chung |
| 2004/0144308 A1 | 7/2004 | Yudovsky |
| 2004/0144311 A1 | 7/2004 | Chen et al. |
| 2004/0170403 A1 | 9/2004 | Lei |
| 2004/0187304 A1 | 9/2004 | Chen et al. |
| 2004/0203254 A1 | 10/2004 | Conley et al. |
| 2004/0219784 A1 | 11/2004 | Kang et al. |
| 2004/0224506 A1 | 11/2004 | Choi et al. |
| 2004/0235285 A1 | 11/2004 | Kang et al. |
| 2004/0253375 A1 | 12/2004 | Ivanov et al. |
| 2004/0256351 A1 | 12/2004 | Chung et al. |
| 2005/0006799 A1 | 1/2005 | Gregg et al. |
| 2005/0009325 A1 | 1/2005 | Chung et al. |
| 2005/0059240 A1 | 3/2005 | Choi et al. |
| 2005/0064207 A1 | 3/2005 | Senzaki et al. |
| 2005/0070126 A1 | 3/2005 | Senzaki |
| 2005/0095859 A1 | 5/2005 | Chen et al. |
| 2005/0104142 A1 | 5/2005 | Narayanan et al. |
| 2005/0153571 A1 | 7/2005 | Senzaki |
| 2005/0189072 A1 | 9/2005 | Chen et al. |
| 2005/0233156 A1 | 10/2005 | Senzaki et al. |
| 2005/0255243 A1 | 11/2005 | Senzaki |
| 2005/0257735 A1 | 11/2005 | Guenther |
| 2006/0257295 A1 | 11/2006 | Chen et al. |
| 2007/0067609 A1 | 3/2007 | Chen et al. |
| 2007/0079759 A1 | 4/2007 | Lee et al. |
| 2007/0089817 A1 | 4/2007 | Ganguli et al. |
| 2007/0110898 A1 | 5/2007 | Ganguli et al. |
| 2007/0235085 A1 | 10/2007 | Nakashima et al. |
| 2008/0044573 A1 | 2/2008 | Chen et al. |
| 2008/0099933 A1 | 5/2008 | Choi et al. |
| 2008/0149031 A1 | 6/2008 | Chu et al. |
| 2008/0216743 A1 | 9/2008 | Chen et al. |

FOREIGN PATENT DOCUMENTS

| | | |
|---|---|---|
| EP | 1077484 | 2/2001 |
| EP | 1079001 | 2/2001 |
| EP | 1167569 | 1/2002 |
| GB | 2151662 | 7/1985 |
| GB | 2223509 | 4/1990 |
| GB | 2355727 | 5/2001 |
| JP | 56035426 | 4/1981 |
| JP | 58098917 | 6/1983 |
| JP | 01175225 | 7/1989 |
| JP | 04291916 | 10/1992 |
| JP | 05047666 | 2/1993 |
| JP | 05206036 | 8/1993 |
| JP | 05234899 | 9/1993 |
| JP | 05270997 | 10/1993 |
| JP | 06224138 | 8/1994 |
| JP | 06317520 | 11/1994 |
| JP | 07300649 | 11/1995 |
| JP | 2000122725 | 4/2000 |
| JP | 2000212752 | 8/2000 |
| JP | 2000319772 | 11/2000 |
| JP | 2001020075 | 1/2001 |
| JP | 2001111000 | 4/2001 |
| JP | 2001172767 | 6/2001 |
| WO | WO-9617107 | 6/1996 |
| WO | WO-9901595 | 1/1999 |
| WO | WO-9929924 | 6/1999 |
| WO | WO-9965064 | 12/1999 |
| WO | WO-0016377 | 3/2000 |
| WO | WO-0054320 | 9/2000 |
| WO | WO-0079575 | 12/2000 |
| WO | WO-0079576 | 12/2000 |
| WO | WO-0115220 | 3/2001 |
| WO | WO-0117692 | 3/2001 |
| WO | WO-0127346 | 4/2001 |
| WO | WO-0127347 | 4/2001 |
| WO | WO-0129280 | 4/2001 |
| WO | WO-0129891 | 4/2001 |
| WO | WO-0129893 | 4/2001 |
| WO | WO-0136702 | 5/2001 |
| WO | WO-0166832 | 9/2001 |
| WO | WO-0201628 | 1/2002 |
| WO | WO-0208485 | 1/2002 |
| WO | WO-0208488 | 1/2002 |
| WO | WO-0243115 | 5/2002 |
| WO | WO-0245167 | 6/2002 |
| WO | WO-0245871 | 6/2002 |
| WO | WO-0246489 | 6/2002 |
| WO | WO-03004723 | 1/2003 |
| WO | WO-03023835 | 3/2003 |
| WO | WO-04008491 | 1/2004 |
| WO | WO-04106584 | 12/2004 |

OTHER PUBLICATIONS

Clark-Phelps, et al. "Engineered Tantalum Aluminate and Hafnium Aluminate ALD Films for Ultrathin Dielectric Films with Improved Electrical and Thermal Properties," *Mat. Res. Soc. Symp. Proc.*, vol. 670, Materials Research Society, (2001), pp. K2.2.1-K2.2.6.

Eisenbraun, et al. "Atomic Layer Deposition (ALD) of Tantalum-based materials for zero thickness copper barrier applications," Proceedings of the IEEE 2001 International Interconnect Technology Conference, 2001, pp. 207-209.

Goswami, et al. Transition Metals Show Promise as Copper Barriers, Semiconductor International, ATMI, San Jose—May 1, 2004.

Hartje, et al. "CVD reactor source—has irradiated surface to vaporize surface of reaction component held solid by internal cooling," Patent No. DD 274057, Dec. 6, 1956, AKAD Wissenschaftten DDR, Derwent WPI File, Record No. 008261396, Abstract.cited by other.

Hiltunen, et al. "Nitrides of Titanium, Niobium, Tantalum and Molybdenum Grown as Thin Films by the Atomic Layer Epitaxy Method," Thin Solid Films, vol. 166, (1988), pp. 149-154.

Hong, et al. "Characteristics of PAALD-TaN thin films derived from TAIMATA precursor for copper metallization," Internconnect Technology Conference, 2004, Proceedings of the IEEE 2004 International, Jun. 7-9, 2004, pp. 9-11.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; pp. 1670-1675.

Kukli, et al. "In situ Study of Atomic Layer Epitaxy Growth of Tantalum Oxide Thin Films From $Ta(OC_2H_5)_5$ and $H_2O$," Applied Surface Science, vol. 112, Mar. 1997, pp. 236-242.

Kukli, et al. "Properties of $\{Nb_{1-x}Ta_x\}_2O_5$ Solid Solutions and $\{Nb_{1-x}Ta_x\}_2O_5ZrO_2$ Nanolaminates Grown by Atomic Layer Epitaxy," 1997; pp. 785-793.

Kukli, et al. "Properties of $Ta_2O_5$-Based Dielectric Nanolaminates Deposited by Atomic Layer Epitaxy," Journal of the Electrochemical Society, vol. 144, No. 1, Jan. 1997; p. 300-306.

Kukli, et al. "Tailoring the Dielectric Properties of $HfO_2$-$Ta_2$-$O_5$ Nanolaminates," Applied Physics Letters, vol. 68, No. 26, Jun. 24, 1996; p. 3737-3739.

Leskela, et al. "Atomic Layer Epitaxy in Deposition of Various Oxide and Nitride Thin Films," Journal De Physique IV, Colloque C5, Supplement au Journal de Physique II, vol. 5, Jun. 1995, pp. C5-937-C5-951.

NEC Corp. "Gasifier for sublimation for CVD unit—has container for solid material, 1.sup.st heater, 2.sup.nd heater to heat gas trapped by mesh structure, etc.," Patent No. 5-214537, Aug. 24, 1993, Derwent WPI File, Record No. 009606474, Abstract.

Niinisto, et al. "Synthesis of Oxide Thin Films and Overlayers by Atomic Layer Epitaxy for Advanced Applicaitions," Materials Science and Engineering B41 (1996), 23-29.

Pamplin "Crystal Growth," MBE-Molecular Beam Epitaxial Evaporative Growth, Pergamon Press, Sec. Edition, vol. 16, 1981, pp. 227-229.

Park, et al. "Performance improvement of MOSFET with $HfO_2Al_2O_3$ laminate gate dielectric and CVD-TaN metal gate deposited by TAIMATA", Electron Devices Meeting, 2003. IEDM '03 Technical Digest. IEEE International Dec. 8-10, 2003, pp. 13.6.1-13.6.4.

PCT International Preliminary Report on Patentability and, Written Opinion dated Dec. 1, 2005 for International Application No. PCT/US2004/016715.

PCT International Search Report and the Written Opinion dated Apr. 14, 2004 for International Application No. PCT/US2003/22186.

PCT International Search Report and the Written Opinion dated Nov. 2, 2004 for International Application No. PCT/US2004/016715.

PCT International Search Report dated Feb. 16, 2003 for International Application No. PCT/US02/02651.

PCT International Search Report dated May 8, 2003 for International Application No. PCT/US02/34553.

PCT International Search Report dated May 9, 2003 for International Application No. PCT/US02/34277.

Ravetz, et al. "Properties of Solution TMI.TM. as an OMVPE Source," J. Electron, Mater. (USA) vol. 29, No. 1, Jan. 2000, pp. 156-160.

Ritala, et al. "Controlled Growth of TaN, $Ta_3N_5$, and $TaO_xN_y$ Thin Films by Atomic Layer Deposition," Chem. Mater., vol. 11, No. 7, 1999, pp. 1712-1718.

Ritala, et al. "Perfectly Conformal TiN and $Al_2O_3$ Films Deposited by Atomic Layer Deposition, Chemical Vapor Deposition," Jan. 1999, 5, No. 1, pp. 6-9.

Rossnagel, et al. "Plasma-Enhanced Atomic Layer Deposition of Ta and Ti for Interconnect Diffusion Barriers," J. Vac. Sci. Technol. B 18(4), Jul./Aug. 2000, pp. 2016-2020.

Shenai, et al. "Correlation of vapor pressure equation and film properties with trimethylindium purity for the MOVPE grown III-V compounds," Journal of Crystal Growth 248 (2003) pp. 91-98.

Sigma-Aldrich Certificate of Analysis, http://infonew.sigma-aldrich.com/cgi-bin/gx.cgi/Applogic+COfAInfo/Start?P—roduct No=49 . . . , dated Mar. 16, 2003.

* cited by examiner

METHOD AND APPARATUS FOR PROVIDING PRECURSOR GAS TO A PROCESSING CHAMBER

CROSS-REFERENCE TO RELATED APPLICATIONS

This application is a continuation of U.S. Ser. No. 11/613,153, filed Dec. 19, 2006, and issued as U.S. Pat. No. 7,429,361, which is a continuation of U.S. Ser. No. 10/198,727, filed Jul. 17, 2002, and issued as U.S. Pat. No. 7,186,385, which are incorporated herein by reference in their entirety.

BACKGROUND OF THE INVENTION

1. Field of the Invention

Embodiments of the invention generally relate to a method and apparatus for providing gas to a processing chamber.

2. Description of the Related Art

Integrated circuits have evolved into complex devices that can include millions of transistors, capacitors and resistors on a single chip. The evolution of chip design continually requires faster circuitry and greater circuit density demanding increasingly precise fabrication processes. The precision processing of substrates requires precise control of temperature, rate and pressure in the delivery of fluids used during processing. The control of these fluids is typically facilitated using a gas panel that contains various valves, regulators, flow controllers and the like.

Fluids used during processing are provided to the gas panel and liquid or gas is formed from a central gas source or a supply vessel positioned proximate the panel. Some process gases may be generated at or near the gas panel from a solid material through a sublimation process. Sublimation is generally a process through which a gas is produced directly from a solid at a certain pressure and temperature without passing through a liquid state. Some gases that may be produced through a sublimation process include xenon difluoride, nickel carbonyl, tungsten hexacarbonyl, and pentakis(dimethylamino) tantalum (PDMAT) among others. As these materials tend to be very active and expensive, careful control of the sublimation process is required in order to manage the generation of the sublimed solid without undue waste.

A conventional sublimation process is typically performed in a heated vessel loaded or filled with a solid precursor material to be sublimed. As gas is needed, the vessel walls and/or tray supporting the solid precursor material are heated and the gas is produced.

An alternative gas generation process includes mixing a solid or liquid precursor material with a liquid. A carrier gas is then bubbled through the mixture to carry the generated process gas.

However, as the carrier gas is bubbled through or impacted against either a solid precursor or liquid/solid mixture, particulates from the solid precursor and or liquid may become entrained in the carrier gas and transferred into the process chamber. Liquid or solid particulates may become a source of chamber or substrate contamination. Thus, reduction of particulates passing from precursor gas generator into a processing chamber would serve at least two purposes. First, such a reduction in particulates would reduce substrate defects. Second, a reduction in particulates would reduce the downtime required for cleaning the contaminated chamber surfaces.

Therefore, there is a need for an improved method and apparatus for providing a precursor gas to a processing chamber.

SUMMARY OF THE INVENTION

One aspect of the present invention generally provides an apparatus for generating gas for a processing system. In one embodiment, the apparatus for generating gas for a processing system includes a canister containing a precursor material. The canister includes a top, a bottom, and a sidewall defining an interior volume. The interior volume has an upper region and a lower region, wherein the lower region is at least partially filled by the precursor material. An inlet port and an outlet port are formed through the canister and are in communication with the upper region. At least one baffle is disposed within the upper region of the canister between the inlet and outlet port.

In another aspect of the invention, a method for generating gas for a processing system is provided. In one embodiment, the method for generating gas includes the steps of providing a precursor material contained in the lower region of the canister, flowing a carrier gas from the inlet port through the upper region of the canister along an extended mean path to the outlet port, and heating the precursor material to generate a process gas.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION

Figure 1:
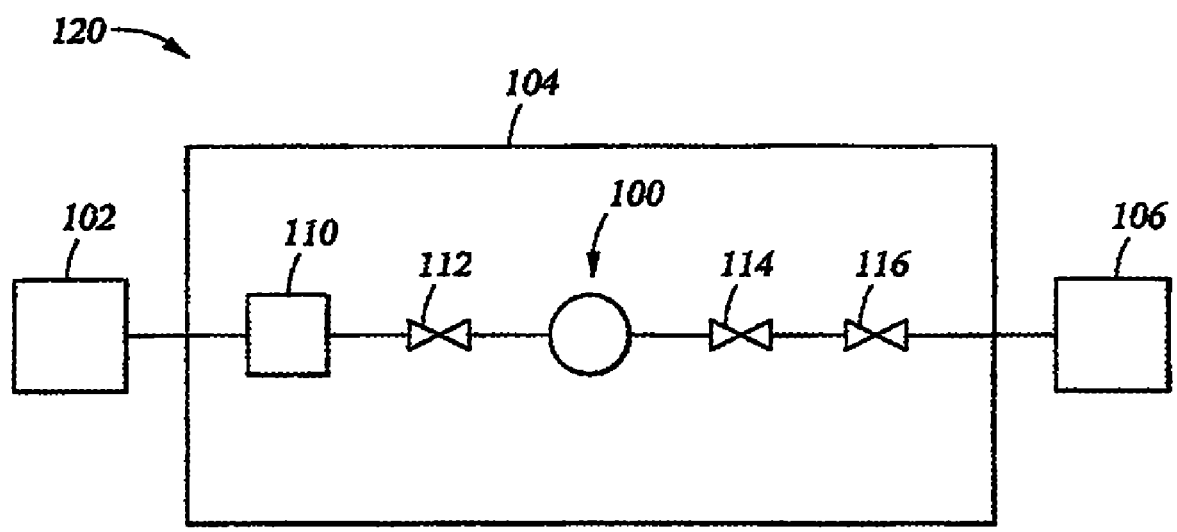
FIG. 1 is a simplified schematic view of a processing system having one embodiment of a gas generation system.

FIG. 1 generally depicts a simplified schematic of a semiconductor wafer processing system 120. The processing system 120 generally includes a processing chamber 106 coupled to a gas delivery system 104. The processing chamber 106 may be any suitable processing chamber, for example, those available from Applied Materials, Inc. located in Santa Clara, Calif. Exemplary processing chambers include DPS CENTURA® etch chambers, PRODUCER® chemical vapor deposition chambers, and ENDURA® physical vapor deposition chambers, among others.

The gas delivery system 104 generally controls the rate and pressure at which various process and inert gases are delivered to the processing chamber 106. The number and types of process and other gases delivered to the processing chamber 106 are generally selected based on the process to be performed in the processing chamber 106 coupled thereto.

Although for simplicity a single gas delivery circuit is depicted in the gas delivery system 104 shown in FIG. 1, it is contemplated that additional gas delivery circuits may be utilized.

The gas delivery system 104 is generally coupled between a carrier gas source 102 and the processing chamber 106. The carrier gas source 102 may be a local or remote vessel or a centralized facility source that supplies the carrier gas throughout the facility. The carrier gas source 102 typically supplies a carrier gas such as argon, nitrogen, helium or other inert or non-reactive gas.

The gas delivery system 104 typically includes a flow controller 110 coupled between the carrier gas source 102 and a process gas source canister 100. The flow controller 110 may be a proportional valve, modulating valve, needle valve, regulator, mass flow controller or the like. One flow controller 110 that may be utilized is available from Sierra Instruments, Inc., located in Monterey, Calif.

The source canister 100 is typically coupled to and located between a first and a second valve 112, 114. In one embodiment, the first and second valves 112, 114 are coupled to the canister 100 and fitted with disconnect fittings (not shown) to facilitate removal of the valves 112, 114 with the canister 100 from the gas delivery system 104. A third valve 116 is disposed between the second valve 114 and the processing chamber 106 to prevent introduction of contaminates into the processing chamber 106 after removal of the canister 100 from the gas delivery system 104.

Figure 2B:
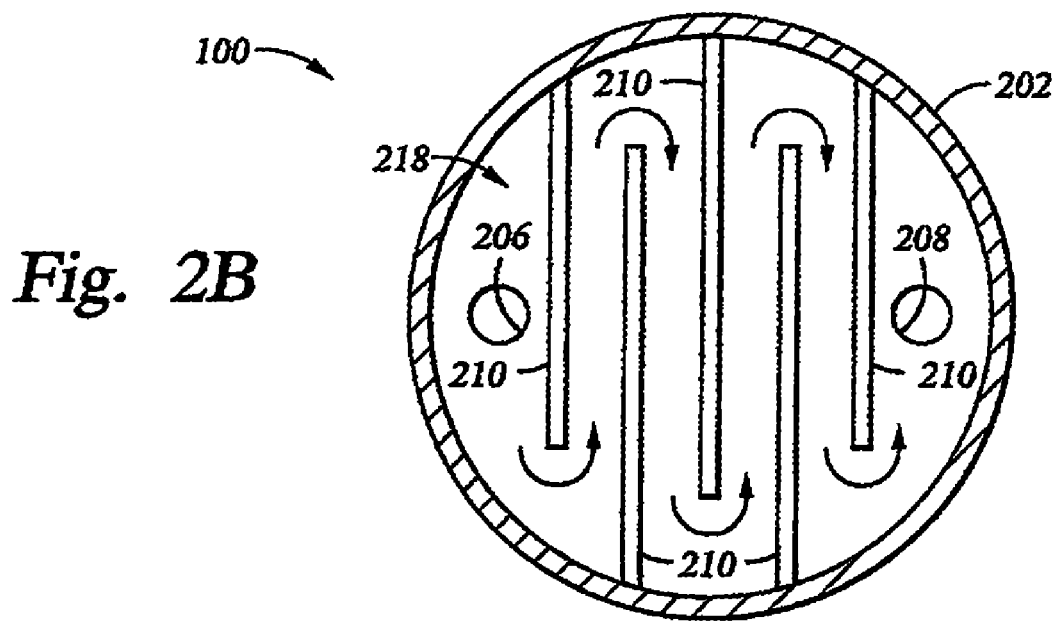
FIG. 2B is a sectional top view of one embodiment of a gas generation canister.
Figure 2A:
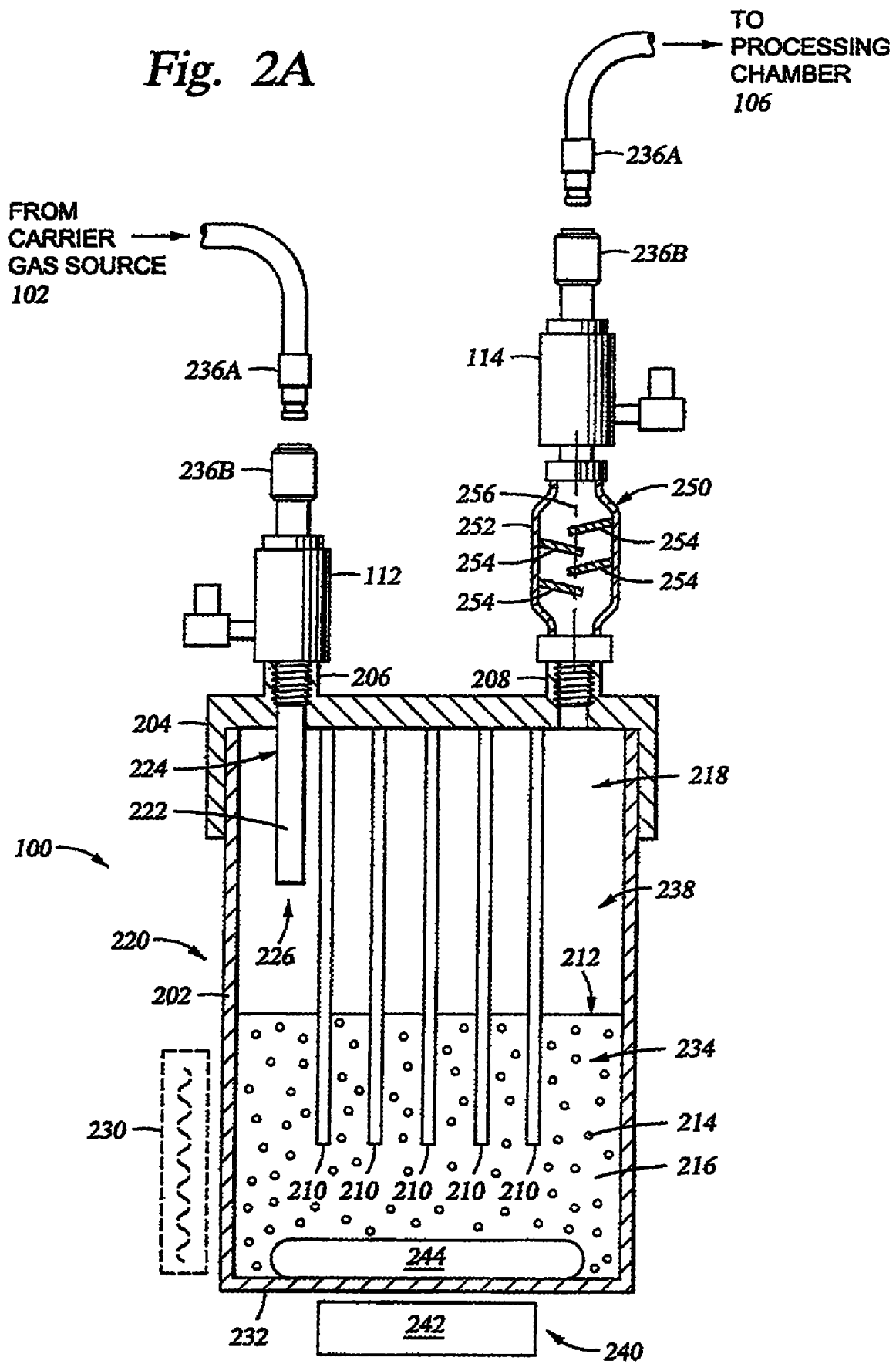
FIG. 2A is a sectional side view of one embodiment of a gas generation canister.

FIGS. 2A and 2B depict sectional views of one embodiment of the canister 100. The canister 100 generally comprises an ampoule or other sealed container having a housing 220 that is adapted to hold precursor materials 214 from which a process (or other) gas may be generated through a sublimation or vaporization process. Some solid precursor materials 214 that may generate a process gas in the canister 100 through a sublimation process include xenon difluoride, nickel carbonyl, tungsten hexacarbonyl, and pentakis(dimethylamino) tantalum (PDMAT), among others. Some liquid precursor materials 214 that may generate a process gas in the canister 100 through a vaporization process include tetrakis (dimethylamino) titanium (TDMAT), tertbutyliminotris(diethylamino) tantalum (TBTDET), and pentakis(ethylmethylamino) tantalum (PEMAT), among others. The housing 220 is generally fabricated from a material substantially inert to the precursor materials 214 and gas produced therefrom, and thus, the material of construction may vary based on gas being produced. In one embodiment, tungsten hexacarbonyl is generated within the canister 100 and the housing 220 is fabricated from a material substantially inert to tungsten hexacarbonyl, for example, stainless steel, aluminum, PFA, or other suitable non-organic material.

The housing 220 may have any number of geometric forms. In the embodiment depicted in FIGS. 2A and 2B, the housing 220 comprises a cylindrical sidewall 202 and a bottom 232 sealed by a lid 204. The lid 204 may be coupled to the sidewall 202 by welding, bonding, adhesives, or other leak-tight method. Alternately, the joint between the sidewall 202 and the lid 204 may have a seal, o-ring, gasket, or the like, disposed therebetween to prevent leakage from the canister 100. The sidwell 202 may alternatively comprise other hollow geometric forms, for example, a hollow square tube.

An inlet port 206 and an outlet port 208 are formed through the canister to allow gas flow into and out of the canister 100. The ports 206, 208 may be formed through the lid 204 and/or sidewall 202 of the canister 100. The ports 206, 208 are generally sealable to allow the interior of the canister 100 to be isolated from the surrounding environment during removal of the canister 100 from the gas delivery system 104. In one embodiment, valves 112, 114 are sealingly coupled to ports 206, 208 to prevent leakage from the canister 100 when removed from the gas delivery system 104 (shown in FIG. 1) for recharging of the precursor material 214 or replacement of the canister 100. Mating disconnect fittings 236A, 236B may be coupled to valves 112, 114 to facilitate removal and replacement of the canister 100 to and from the gas delivery system 104. Valves 112, 114 are typically ball valves or other positive sealing valves that allows the canister 100 to be removed from the system efficiently loaded and recycled while minimizing potential leakage from the canister 100 during filling, transport, or coupling to the gas delivery system 104. Alternatively, the canister 100 can be refilled through a refill port (not shown) such as a small tube with a VCR fitting disposed on the lid 204 of the canister 100.

The canister 100 has an interior volume 238 having an upper region 218 and a lower region 234. The lower region 234 of canister 100 is at least partially filled with the precursor materials 214. Alternately, a liquid 216 may be added to a solid precursor material 214 to form a slurry 212. The precursor materials 214, the liquid 216, or the premixed slurry 212 may be introduced into canister 100 by removing the lid 204 or through one of the ports 206, 208. The liquid 216 is selected such that it is non-reactive with the precursor materials 214, that the precursor materials 214 are insoluble therein, and that the liquid 216 has a negligible vapor pressure compared to the precursor materials 214. For example, a liquid 216 added to a solid precursor material 214 such as tungsten hexacarbonyl should have a higher vapor pressure than the tungsten hexacarbonyl by greater than about $1 \times 10^3$ Torr to ensure that the sublimating vapor comprises mainly tungsten hexacarbonyl and only a negligible quantity of liquid.

Precursor materials 214 mixed with the liquid 216 may be sporadically agitated to keep the precursor materials 214 suspended in the liquid 216 in the slurry 212. In one embodiment, precursor materials 214 and the liquid 216 are agitated by a magnetic stirrer 240. The magnetic stirrer 240 includes a magnetic motor 242 disposed beneath the bottom 232 of the canister 100 and a magnetic pill 244 disposed in the lower region 234 of the canister 100. The magnetic motor 242 operates to rotate the magnetic pill 244 within the canister 100, thereby mixing the slurry 212. The magnetic pill 244 should have an outer coating of material that is a non-reactive with the precursor materials 214, the liquid 216, or the canister 100. Suitable magnetic mixers are commercially available. One example of a suitable magnetic mixer is IKA-MAG® REO available from IKA® Works in Wilmington, N.C. Alternatively, the slurry 212 may be agitated other means, such as by a mixer, a bubbler, or the like.

The agitation of the liquid 216 may induce droplets of the liquid 216 to become entrained in the carrier gas and carried toward the processing chamber 106. To prevent such droplets of liquid 216 from reaching the processing chamber 106, an oil trap 250 may optionally be coupled to the exit port 208 of the canister 100. The oil trap 250 includes a body 252 containing a plurality of interleaved baffles 254 which extend past a centerline 256 of the oil trap body 252 and are angled at least slightly downward towards the canister 100. The baffles 254 force the gas flowing towards the processing chamber 106 to flow a tortuous path around the baffles 254. The surface area of the baffles 254 provides a large surface area exposed to the flowing gas to which oil droplets that may be entrained in the gas adhere to. The downward angle of the baffles 254 allows any oil accumulated in the oil trap to flow downward and back into the canister 100.

The canister 100 includes at least one baffle 210 disposed within the upper region 218 of the canister 100. The baffle 210 is disposed between inlet port 206 and outlet port 208, creating an extended mean flow path, thereby preventing direct (i.e., straight line) flow of the carrier gas from the inlet port 206 to the outlet port 208. This has the effect of increasing the mean dwell time of the carrier gas in the canister 100 and increasing the quantity of sublimated or vaporized precursor gas carried by the carrier gas. Additionally, the baffles 210 direct the carrier gas over the entire exposed surface of the precursor material 214 disposed in the canister 100, ensuring repeatable gas generation characteristics and efficient consumption of the precursor materials 214.

The number, spacing and shape of the baffles 210 may be selected to tune the canister 100 for optimum generation of precursor gas. For example, a greater number of baffles 210 may be selected to impart higher carrier gas velocities at the precursor material 214 or the shape of the baffles 210 may be configured to control the consumption of the precursor material 214 for more efficient usage of the precursor material.

The baffle 210 may be attached to the sidewall 202 or the lid 204, or the baffle 210 may be a prefabricated insert designed to fit within the canister 100. In one embodiment, the baffles 210 disposed in the canister 100 comprise five rectangular plates fabricated of the same material as the sidewall 202. Referring to FIG. 2B, the baffles 210 are welded or otherwise fastened to the sidewall 202 parallel to each other. The baffles 210 are interleaved, fastened to opposing sides of the canister in an alternating fashion, such that a serpentine extended mean flow path is created. Furthermore, the baffles 210 are situated between the inlet port 206 and the outlet port 208 on the lid 204 when placed on the sidewall 202 and are disposed such that there is no air space between the baffles 210 and the lid 204. The baffles 210 additionally extend at least partially into the lower region 234 of the canister 100, thus defining an extended mean flow path for the carrier gas flowing through the upper region 218.

Optionally, an inlet tube 222 may be disposed in the interior volume 238 of the canister 100. The tube 222 is coupled by a first end 224 to the inlet port 206 of the canister 100 and terminates at a second end 226 in the upper region 218 of the canister 100. The tube 222 injects the carrier gas into the upper region 218 of the canister 100 at a location closer to the precursor materials 214 or the slurry 212.

The precursor materials 214 generate a precursor gas at a predefined temperature and pressure. Sublimating or vaporized gas from the precursor materials 214 accumulate in the upper region 218 of the canister 100 and are swept out by an inert carrier gas entering through inlet port 206 and exiting outlet port 208 to be carried to the processing chamber 106. In one embodiment, the precursor materials 214 are heated to a predefined temperature by a resistive heater 230 disposed proximate to the sidewall 202. Alternately, the precursor materials 214 may be heated by other means, such as by a cartridge heater (not shown) disposed in the upper region 218 or the lower region 234 of the canister 100 or by preheating the carrier gas with a heater (not shown) placed upstream of the carrier gas inlet port 206. To maximize uniform heat distribution throughout the slurry 212, the liquid 216 and the baffles 210 should be good conductors of heat.

In one exemplary mode of operation, the lower region 234 of the canister 100 is at least partially filled with a mixture of tungsten hexacarbonyl and diffusion pump oil to form the slurry 212. The slurry 212 is held at a pressure of about 5 Torr and is heated to a temperature in the range of about 40° C. to about 50° C. by a resistive heater 230 located proximate to the canister 100. Carrier gas in the form of argon is flowed through inlet port 206 into the upper region 218 at a rate of about 200 standard cc/min. The argon flows in an extended mean flow path defined by the tortuous path through the baffles 210 before exiting the canister 100 through outlet port 208, advantageously increasing the mean dwell time of the argon in the upper region 218 of the canister 100. The increased dwell time in the canister 100 advantageously increases the saturation level of sublimated tungsten hexacarbonyl vapors within the carrier gas. Moreover, the tortuous path through the baffles 210 advantageously exposes the substantially all of the exposed surface area of the precursor material 214 to the carrier gas flow for uniform consumption of the precursor material 214 and generation of the precursor gas.

Figure 3:
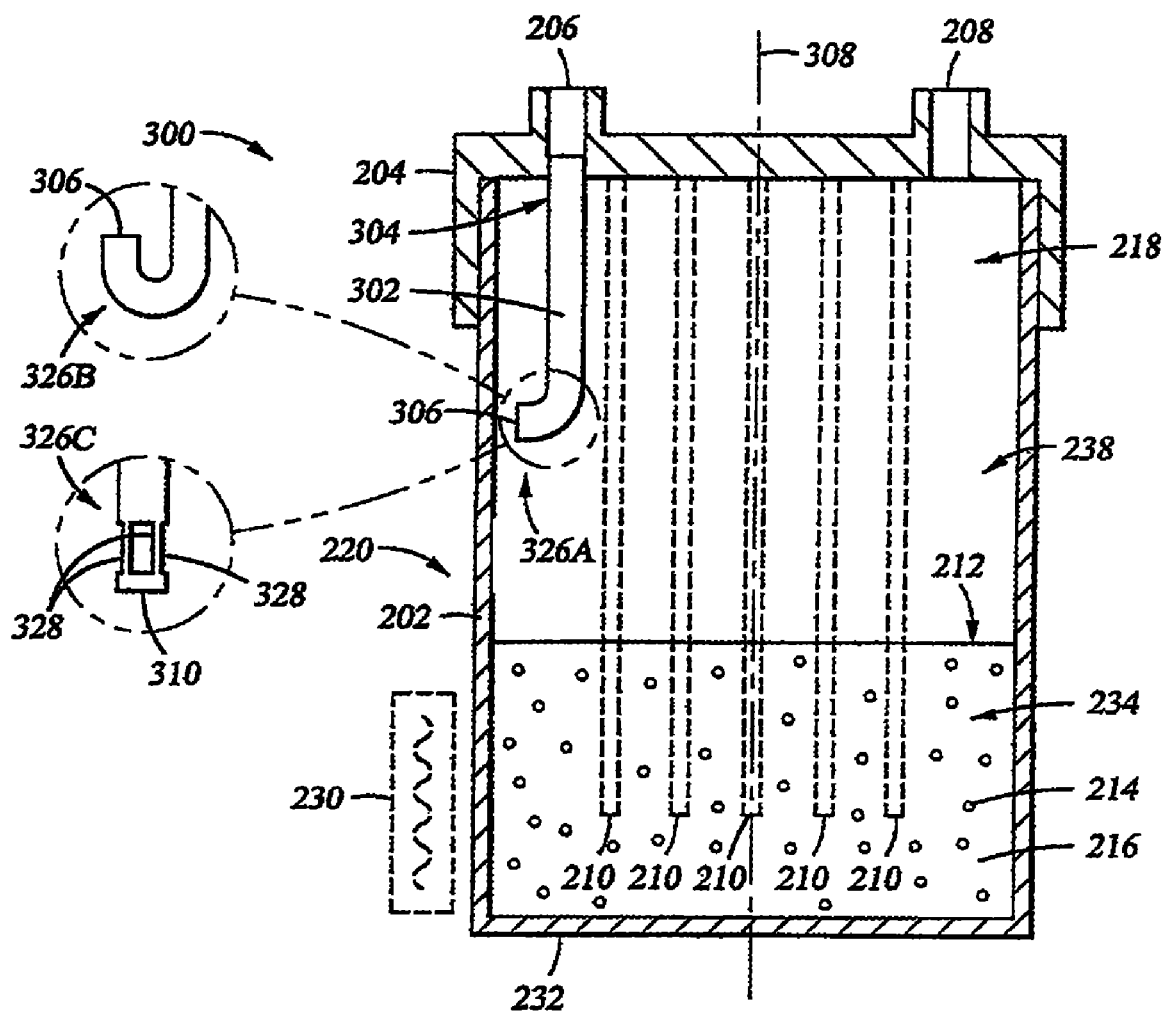
FIG. 3 is a sectional view of another embodiment of a gas generation canister.

FIG. 3 depicts a sectional view of another embodiment of a canister 300 for generating a process gas. The canister includes a sidewall 202, a lid 204 and a bottom 232 enclosing an interior volume 238. At least one of the lid 204 or sidewall 202 contains an inlet port 206 and an outlet port 208 for gas entry and egress. The interior volume 238 of the canister 300 is split into an upper region 218 and a lower region 234. Precursor materials 214 at least partially fill the lower region 234. The precursor materials 214 may be in the form of a solid, liquid or slurry, and are adapted to generate a process gas by sublimation and/or vaporization.

A tube 302 is disposed in the interior volume 238 of the canister 300 and is adapted to direct a flow of gas within the canister 300 away from the precursor materials 214, advantageously preventing gas flowing out of the tube 302 from directly impinging the precursor materials 214 and causing particulates to become airborne and carried through the outlet port 208 and into the processing chamber 106. The tube 302 is coupled at a first end 304 to the inlet port 206. The tube 302 extends from the first end 304 to a second end 326A that is positioned in the upper region 218 above the precursor materials 214. The second end 326A may be adapted to direct the flow of gas toward the sidewall 202, thus preventing direct (linear or line of sight) flow of the gas through the canister 300 between the ports 206, 208, creating an extended mean flow path.

In one embodiment, an outlet 306 of the second end 326A of the tube 302 is oriented an angle of about 15° to about 90° relative to a center axis 308 of the canister 300. In another embodiment, the tube 302 has a 'J'-shaped second end 326B that directs the flow of gas exiting the outlet 306 towards the lid 204 of the canister 300. In another embodiment, the tube 302 has a second end 326C having a plug or cap 310 closing the end of the tube 302. The second end 326C has at least one opening 328 formed in the side of the tube 302 proximate the cap 310. Gas, exiting the openings 328, is typically directed perpendicular to the center axis 308 and away from the precursor materials 214 disposed in the lower region 234 of the canister 300. Optionally, an at least one baffle 210 (shown in phantom) as described above may be disposed within the chamber 300 and utilized in tandem with any of the embodiments of the tube 302 described above.

In one exemplary mode of operation, the lower region 234 of the canister 300 is at least partially filled with a mixture of tungsten hexacarbonyl and diffusion pump oil to form the slurry 212. The slurry 212 is held at a pressure of about 5 Torr and is heated to a temperature in the range of about 40° C. to about 50° C. by a resistive heater 230 located proximate to the canister 300. A carrier gas in the form of argon is flowed through the inlet port 206 and the tube 302 into the upper region 218 at a rate of about 200 standard cc/min. The second end 326A of the tube 302 directs the flow of the carrier gas in an extended mean flow path away from the outlet port 208, advantageously increasing the mean dwell time of the argon in the upper region 218 of the canister 300 and preventing direct flow of carrier gas upon the precursor materials 214 to minimize particulate generation. The increased dwell time in the canister 300 advantageously increases the saturation level of sublimated tungsten hexacarbonyl gas within the carrier gas while the decrease in particulate generation improves product yields, conserves source solids, and reduces downstream contamination.

Figure 4:
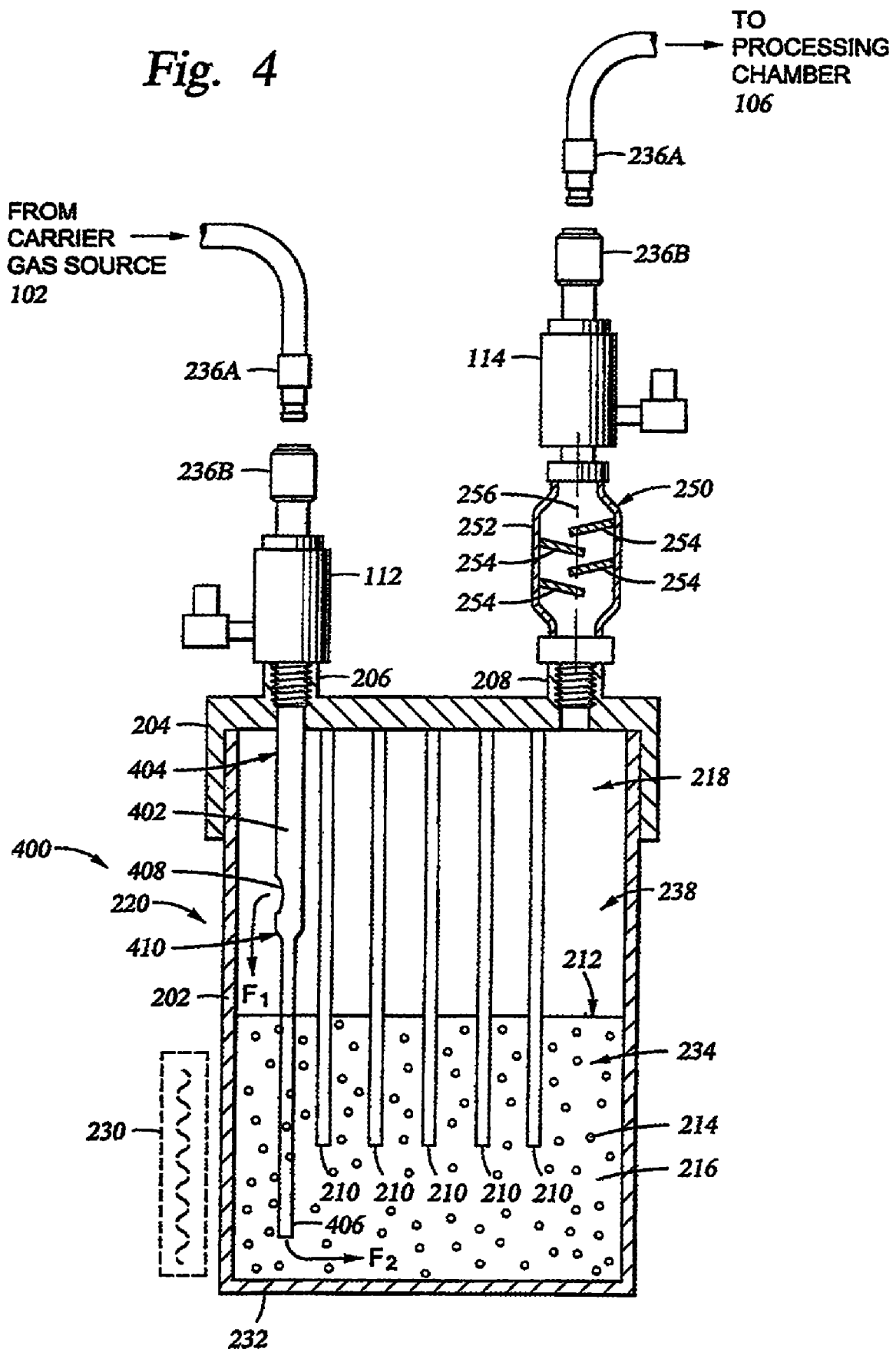
FIG. 4 is a sectional side view of another embodiment of a gas generation canister.

FIG. 4 depicts a sectional view of another embodiment of a canister 400 for generating a precursor gas. The canister 400 includes a sidewall 202, a lid 204 and a bottom 232 enclosing an interior volume 238. At least one of the lid 204 or sidewall 202 contains an inlet port 206 and an outlet port 208 for gas entry and egress. Inlet and outlet ports 206, 208 are coupled to valves 112, 114 fitted with mating disconnect fittings 236A, 236B to facilitate removal of the canister 400 from the gas delivery system 104. Optionally, an oil trap 250 is coupled between the outlet port 208 and the valve 114 to capture any oil particulate that may be present in the gas flowing to the process chamber 106.

The interior volume 238 of the canister 300 is split into an upper region 218 and a lower region 234. Precursor materials 214 and a liquid 216 at least partially fill the lower region 234. A tube 402 is disposed in the interior volume 238 of the canister 400 and is adapted to direct a first gas flow F1 within the canister 400 away from the precursor material and liquid mixture and to direct a second gas flow F2 through the mixture. The flow F1 is much greater than the flow F2. The flow F2 is configured to act as a bubbler, being great enough to agitate the precursor material and liquid mixture but not enough to cause particles or droplets of the precursor materials 214 or liquid 216 from becoming airborne. Thus, this embodiment advantageously agitates the precursor material and liquid mixture while minimizing particulates produced due to direct impingement of the gas flowing out of the tube 402 on the precursor materials 214 from becoming airborne and carried through the outlet port 208 and into the processing chamber 106.

The tube 402 is coupled at a first end 404 to the inlet port 206. The tube 402 extends from the first end 404 to a second end 406 that is positioned in the lower region 234 of the canister 400, within the precursor material and liquid mixture. The tube 402 has an opening 408 disposed in the upper region 218 of the canister 400 that directs the first gas flow F1 towards a sidewall 202 of the canister 400. The tube 400 has a restriction 410 disposed in the upper region 238 of the canister 400 located below the opening 408. The restriction 410 serves to decrease the second gas flow F2 flowing toward the second end 406 of the tube 402 and into the slurry 212. By adjusting the amount of the restriction, the relative rates of the first and second gas flows F1 and F2 can be regulated. This regulation serves at least two purposes. First, the second gas flow F2 can be minimized to provide just enough agitation to maintain suspension or mixing of the precursor materials 214 in the liquid 216 while minimizing particulate generation and potential contamination of the processing chamber 106. Second, the first gas flow F1 can be regulated to maintain the overall flow volume necessary to provide the required quantity of sublimated and/or vapors from the precursor materials 214 to the processing chamber 106.

Optionally, an at least one baffle 210 (shown in phantom) as described above may be disposed within the chamber 400 and utilized in tandem with any of the embodiments of the tube 402 described above.

While the foregoing is directed to the preferred embodiment of the present invention, other and further embodiments of the invention may be devised without departing from the basic scope thereof. The scope of the invention is determined by the claims that follow.

The invention claimed is:

1. An apparatus for generating a gaseous chemical precursor used in a vapor deposition processing system, comprising:
   a canister comprising a sidewall, a top, and a bottom encompassing an interior volume therein;
   an inlet port and an outlet port in fluid communication with the interior volume;
   an inlet tube extending from the inlet port into the canister, wherein the inlet tube comprises an outlet positioned to direct a gas flow away from the outlet port and towards the sidewall of the canister; and
   a chemical precursor comprising pentakis(dimethylamino) tantalum contained within the interior volume.

2. An apparatus for generating a gaseous chemical precursor used in a vapor deposition processing system, comprising:
   a canister comprising a sidewall, a top, and a bottom encompassing an interior volume therein;
   a solid precursor material contained within the canister;
   an inlet port and an outlet port in fluid communication with the interior volume of the canister;
   a first valve coupled with the canister, disposed upstream to and in fluid communication with the inlet port, and configured to receive gas from a gas source;
   a second valve coupled with the canister, disposed downstream from and in fluid communication with the outlet port, and configured to deliver gas to a processing chamber; and
   an inlet tube extending from the inlet port into the canister, wherein the inlet tube comprises an outlet positioned to direct a gas flow away from the outlet port and towards the sidewall of the canister.

3. The apparatus of claim 2, wherein a precursor slurry contained within the interior volume of the canister comprises the solid precursor material and a non-reactive material that is unreactive towards the solid precursor material.

4. The apparatus of claim 3, wherein the non-reactive material is thermally conductive.

5. The apparatus of claim 4, wherein the solid precursor material comprises pentakis(dimethylamino) tantalum.

6. The apparatus of claim 2, further comprising a plurality of baffles within the interior volume extending between the top and the bottom of the canister.

7. The apparatus of claim 6, wherein the baffles are thermal conductors.

8. The apparatus of claim 7, wherein the baffles comprise a material selected from the group consisting of steel, stainless steel, and aluminum.

9. The apparatus of claim 6, wherein the baffles are positioned to form a tortuous flow path extending from the inlet port, around the baffles, and to the outlet port.

10. The apparatus of claim 6, wherein the baffles extend from a prefabricated insert within the canister.

11. A method for generating a gaseous chemical precursor used in a vapor deposition processing system, comprising:
    heating a solid precursor material within an interior volume of an ampoule assembly to a predetermined temperature, the ampoule assembly comprises:
       a canister comprising a sidewall, a top, and a bottom encompassing the interior volume therein;
       an inlet port and an outlet port in fluid communication with the interior volume; and
       an inlet tube extending from the inlet port into the canister and containing an outlet positioned to direct a gas flow away from the outlet port;

flowing a carrier gas into the canister through the outlet of the inlet tube;

subliming the solid precursor material to form a process gas comprising a gaseous precursor material and the carrier gas; and flowing the process gas out of the canister through the outlet port.

12. The method of claim 11, wherein the outlet of the inlet tube is positioned to direct the gas flow towards the sidewall of the canister.

13. The method of claim 12, wherein the outlet of the inlet tube is positioned to direct the gas flow at an angle within a range from about 15° to about 90° relative to a center axis of the canister.

14. The method of claim 11, wherein the carrier gas is preheated prior to flowing the carrier gas into the canister.

15. The method of claim 14, wherein the carrier gas comprises argon, nitrogen, or helium.

16. The method of claim 11, wherein the solid precursor material comprises pentakis(dimethylamino) tantalum.

17. The method of claim 16, wherein the predetermined temperature of the solid precursor material is within a range from about 40° C. to about 50° C.

18. The method of claim 11, wherein the solid precursor material is heated by a resistive heater disposed proximate the sidewall of the canister.

19. The method of claim 11, wherein baffles are positioned within the canister to form a tortuous flow path extending from the inlet port, around the baffles, and to the outlet port.

20. The method of claim 11, wherein the solid precursor material is a premixed slurry that is added into the canister, and the premixed slurry comprises a solid precursor and a thermally conductive material that is unreactive towards the solid precursor.

21. The apparatus of claim 2, further comprising a first mating disconnect fitting disposed upstream to the first valve, and a second mating disconnect fitting disposed downstream from the second valve, wherein the first and second mating disconnect fittings facilitate removal of the canister from the processing system.

22. The apparatus of claim 2, wherein the first and second valves are ball valves.

* * * * *

UNITED STATES PATENT AND TRADEMARK OFFICE
CERTIFICATE OF CORRECTION

| | | |
|---|---|---|
| PATENT NO. | : 7,569,191 B2 | Page 1 of 1 |
| APPLICATION NO. | : 12/233464 | |
| DATED | : August 4, 2009 | |
| INVENTOR(S) | : Ganguli et al. | |

It is certified that error appears in the above-identified patent and that said Letters Patent is hereby corrected as shown below:

Column 3, Line 60, please delete "sidwell" and insert --sidewall-- therefor.

Signed and Sealed this

Twenty-ninth Day of September, 2009

David J. Kappos
*Director of the United States Patent and Trademark Office*